United States Patent [19]

Nguyen et al.

[11] Patent Number: 5,283,463
[45] Date of Patent: Feb. 1, 1994

[54] HIGH POWER SELF COMMUTATING SEMICONDUCTOR SWITCH

[75] Inventors: Ngon B. Nguyen, Jessup; Franklin B. Jones, Catonsville; Charles S. Kerfoot, Pasadena; Gene A. DiGennaro, Dundalk, all of Md.

[73] Assignee: Westinghouse Electric Corp., Pittsburgh, Pa.

[21] Appl. No.: 846,108

[22] Filed: Mar. 5, 1992

[51] Int. Cl.$^5$ .............. H01L 23/02; H01L 23/12; H01L 23/16

[52] U.S. Cl. .................. 257/692; 257/724; 257/706

[58] Field of Search ............ 257/691, 698, 730, 723, 257/724, 729, 692, 694, 695, 690, 689, 688, 706, 720, 704, 710; 361/395, 386, 388; 337/247; 307/303; 437/205

[56] References Cited

U.S. PATENT DOCUMENTS

| | | | |
|---|---|---|---|
| 3,651,434 | 3/1972 | McGeough et al. | 257/728 |
| 3,784,884 | 1/1974 | Zoroglu | 257/728 |
| 4,881,116 | 11/1989 | Hidada et al. | 257/698 |

Primary Examiner—Sheila V. Clark
Attorney, Agent, or Firm—Eugene LeDonne

[57] ABSTRACT

In one embodiment, the invention is a packaged high power electronic switch in the form of a semiconductor chip having metalized planar cathode and anode terminals and a gate terminal. A refractory annular ring has planar open end faces and side walls having stepped portions. A pair of thermally and electrically conductive planar substrates is bonded to the opposite end faces of the annular ring and is maintained in spaced relation thereby, forming an enclosed space. At least one conductive strap within the space is supported by the stepped portion of the internal side wall and extends to one of the substrates forming an electrical and thermal path. One of said conductive substrates receives one of the planar terminals of the chip in intimate electrical and thermal contact. The strap is electrically coupled to the other of said terminals, for forming a high current path between the substrates via the strap. Additional components, such as a commutating diode and gate protection zener diode, may be employed and provide a self protected switch assembly.

13 Claims, 2 Drawing Sheets

HIGH POWER SELF COMMUTATING SEMICONDUCTOR SWITCH

BACKGROUND OF THE INVENTION

1. Field of the Invention

The invention relates to a high power semiconductor switching device for use in self commutated resonant invertors. More particularly, the invention relates to a MOS control thyristor which employs a high current fast recovery commutating diode and gate protection devices in a single surface mounted package which provides thermal and parasitic loss management.

2. Description of the Prior Art

A MOS Controlled Thyristor (MCT) is a new high power semiconductor switching device which combines the best features of SCR thyristors and power MOSFETs. The MCT has the ability of the SCR to pass extremely large currents with only a small voltage drop, but is controlled by a capacitive MOSFET gate. The MCT is made using standard MOSFET processes, but has an additional PN junction at the base of the chip to form a PNPN thyristor. The surface of the chip is covered with a large number of N and P channel cells which control the chip, effectively dividing it into a large number of very small thyristors connected in parallel.

The basic operation of the device can be understood by considering the equivalent circuit of an MCT 10 in FIG. 1. The thyristor portion of the MCT is replaced by two bipolar transistors 12 and 14 and a pair of respective P and N channel MOSFETs 16 and 18. The anode 20 is at a positive voltage with respect to the cathode 22. The collector current of PNP transistor 12 drives the base of the NPN transistor 14, and vice versa.

Once current starts to flow through the device 10, the two transistors 12 and 14 drive each other and the device latches on. The P channel MOSFET 16, connected between the emitter of the PNP 12 (MCT anode 20) and the base of the NPN 14, provides a small amount of base drive to turn the device on when the gate 24 is negative with respect to anode 20. The N channel MOSFET 18, between the base and emitter of the PNP 14, shorts out the base drive when the gate 24 is positive with respect to anode 20, turning the device 10 off.

The primary shortcoming of the MCT 10 is that if the current is too large when the device is commanded off, the current will concentrate in a few cells, causing local heating and perhaps device failure. This restriction is analogous to the Safe Operating Area (SOA) associated with bipolar devices.

The aforementioned shortcoming does not alter the fact that the MCT 10 is ideally suited for use in high power self commutated resonant invertors. In this type of inverter, relatively high peak currents must be passed with a small voltage drop while the device is turned off by the resonant circuit with essentially zero voltage and current. This application capitalizes on the strengths of the MCT, while neutralizing its weaknesses.

In order to make full use of the MCT the device must be in a package which provides adequate thermal management, low loss, high current interconnections, minimal parasitic inductances and resistances, and small size. None of the packages normally used with power semiconductor devices meet all of these requirements.

The MCT 10 is presently normally packaged as a chip 28 which is solder mounted on a metal substrate 29 and encapsulated in an insulating plastic 30 forming a known TO-220 package 31. The package 31 has an aperture 32 therein and is secured to a metal support 33 by means of a fastener (not shown) which passes through the aperture 32. An insulting wafer 34 is disposed between the substrate 29 and the support 33. The wafer 34, typically a ceramic material such as BeO, provides electrical insulation but also adds thermal resistance to the package 31. This is undesirable because, in some applications, peak currents of 300 amperes are required and existing thermal paths are insufficient for adequately dissipating heat produced by such high currents. Also, large currents are concentrated in a number of thin anode bond wires 35, which couple the chip 28 to package leads 36 and small external leads 37, are soldered to the package leads 36. Concentration of high currents results in undesirably high electrical parasitics.

The parasitic elements which arise in the physical construction of a circuit can be critical in high power applications. The parasitics which are of prime concern are lead resistances and lead inductances. FIG. 3 illustrates an equivalent circuit for MCT 10 shown in FIG. 1 in which a commutating diode 42 is coupled across the MCT 10 in an antiparallel configuration. That is, the anode 44 of the diode 42 is coupled to the cathode 22 of the MCT and vice versa.

In the arrangement illustrated, it will be assumed that all significant parasitic inductances are noted by the symbol L followed by a reference numeral. Likewise, all significant parasitic resistances are noted by the symbol R followed by a reference numeral. When relevant the associated reference numeral is mentioned. Each high power, high frequency lead wire has both parasitic inductance and resistance. These parasitics are especially troublesome and cause the greatest losses. Each low power, high frequency lead wire has both parasitic inductance and resistance. However, at low power, the resistance has a negligible effect on thermal losses, thus, such parasitics are ignored.

L1 and L2 are parasitics associated with the anode and cathode connections of the package. Likewise, R1 and R2 are anode and cathode parasitics associated with the package leads. L3 and L4 are inductive parasitics associated with the lead wires of the MCT 10. Similarly, R3 and R4 are parasitic resistances associated with the device lead wires. L5 and L6 and R5 and R6 are parasitics associated with the lead wires of the antiparallel commutating diode 40. L7 and L8 are parasitic inductances associated with the Kelvin and gate leads, which are low power. Accordingly, parasitic resistances are ignored for these leads.

Large high frequency currents flow from the anode 20 to the cathode 22. Accordingly, any lead contact or resistance R in this path translates directly into power dissipation of about 10 watts per milliohm. This is additional heat which must be removed from the device. The problem is further complicated because high frequency currents tend to flow on the outer surface of conductors, penetrating less than 10 mils. This phenomenon increases the apparent resistance of the conductor.

The parasitic inductances L between elements have the potential to directly result in device failure. While the MCT 10 has a forward blocking capability of over 500 volts, reverse voltages of less than 10 volts can destroy the device. For this reason, the antiparallel commutating diode 42 is required in virtually all applications. Also shown in FIG. 3 is a gate protection feature in the form of back-to-back zener diodes 48 coupled between the gate lead 24 and Kelvin lead 46.

The ability of the diode 42 to limit the reverse voltage on the MCT 10 is restricted by any inductance between the two devices. With a rate of current rise of 500 amps per microsecond, as little as 20 nanohenries of stray inductance can cause device failure. Referring to FIG. 2, the inductance of any one of the bond wires 33 is nearly 10 nanohenries. A similar problem exists with the voltage between the gate 24 and the anode 20 across gate inductance R7, but this problem is partially resolved by the addition of Kelvin connection 46 to serve as gate return.

The package 31 in FIG. 2 is clearly not adequate for the intended applications. Unfortunately, other packages normally used with power devices are little better. For example, known packages such as the TO-3, T-257 and Z-Pack fail on both thermal and high current criteria. Thermal performance is particularly degraded by the use of the voltage isolating ceramic substrate 34 which separates the package 31 from the metal support 33. Resistive losses are increased because even when multiple anode bond wires 33 are employed, current is forced to concentrate into small package leads or pins 36 which can only be connected externally to small lead wires 37, (e.g., AWG #16) through solder joints. Furthermore, since these are single chip packages, the required low inductance between MCT 10 and diode 42 is difficult to achieve.

Conventional power hybrids and modules can provide the required thermal performance and low inductance interconnections between the MCT 10 and diode 42, but cannot pass high currents to the external circuits with acceptable losses, because current is still concentrated through the small pins 36. Known hockey puck packages used with high power SCRs provide excellent cooling, and low loss, low inductance connections, but are far too bulky for the intended applications, and are generally not applicable to a chip as physically as small as the MCT 10.

SUMMARY OF THE INVENTION

This disclosure describes a novel surface mount multichip package which achieves the required performance through a new combination of semiconductor devices, package design and mounting techniques. In one embodiment the invention comprises a package for surface mounting a high power electronic switch in the form of a semiconductor chip having metalized planar cathode and anode terminals and a gate terminal. The switch is operative in response to an enabling signal on the gate terminal to carry a current between the anode and the cathode. A refractory annular ring has planar open end faces and side walls having stepped portions. Thermally and electrically conductive planar substrates are respectively bonded, one each, to the opposite end faces of the annular ring. Each substrate is maintained in spaced relation thereby, forming an enclosed space. At least one conductive strap within the space is supported by the stepped portion of the internal side wall and extends to one of the substrates forming an electrical and thermal path. One of said conductive substrates receives at least one of the planar terminals of the chip in intimate electrical and thermal contact. The strap is electrically coupled to the other of said anode and cathode terminals, for forming a high current path between the substrates via the strap. The substrates provide for dissipation of thermal energy when said switch conducts.

In another embodiment, the invention is a high power self commutating semiconductor switch employing a MOS controlled thyristor (MCT) having opposite first and second planar electrically conductive current carrying terminal faces and a gate. The switch comprises a chip carrier including a conductive base having peripheral marginal edges for surface mounting the MCT chip in intimate thermal and electrical contact with the first current carrying terminal face thereof. A conductive cover portion having peripheral marginal edges is spaced from the base and is in electrical and thermal contact with the second face of the chip. A refractory insulating support ring having opposite faces and an interior stepped portion therebetween is attached to the base and cover at the peripheral edges for surrounding and enclosing the chip in the space between the cover and base. At least one conductive strap is located in electrical and thermal contact with the cover and the base for providing an electrical and thermal path therebetween. The switch when actuated is operative to carry a current between the cover and base via the strap and the base and cover are operative for removing thermal energy resulting from the current flow.

DESCRIPTION OF THE INVENTION

Figure 3:
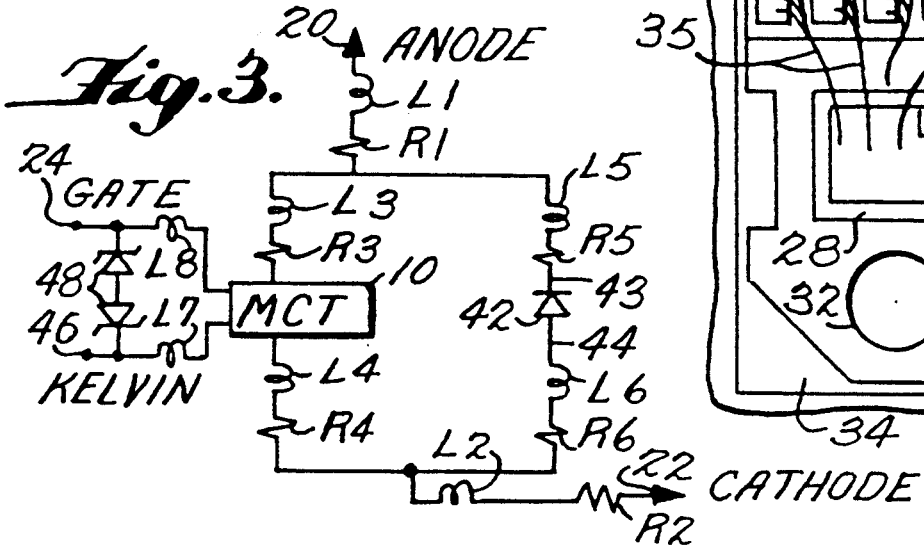
FIG. 3 is an equivalent circuit showing parasitic inductances and resistances for a high power semiconductor switching device which employs an MCT, a commutating diode and gate protection diodes.

FIG. 3 illustrates the equivalent circuit for the high power semiconductor switch 40 employing a MOS controlled thyristor (MCT) 10. The circuit is generally described in Ser. No. 601,556, filed Oct. 23, 1990. FIGS. 4-8 illustrate a package 50 for supporting individual components of the switch 40. The package 50 is for surface mounting of the high power components which include the MCT 10, the high current fast recovery commutating diode 42 and a pair of back-to-back zener diodes 48 for gate protection. The MCT 10 and the diodes 42 and 48 are in the form of wafer devices or chips.

The package 50 includes respective top and bottom electrically and thermally conductive substrates or surfaces 58 and 60. The bottom surface 60 is for surface mounting the components of the switch 40. A refractory support ring 62 has an interior portion 64 and planar open end faces 66 and 68 which respectively carry metalized films 70 and 72 thereon. The respective top and bottom surfaces 58 and 60 are secured to the annular ring 62 by a braze connection with the respective films 70 and 72, thereby forming an enclosed package.

The ring 62 has interior side walls divided into respective upper and lower interior upstanding wall portions 74 and 76 and an intermediate transverse or stepped portion 78. The ring 62 also has an exterior side wall 80 having an exterior stepped portion 82. Metalizations or traces 84A-84D extend between the exterior stepped portion 82 and the interior stepped portion 78 as illustrated. The metalized traces 84A and 84B provide electrical communication for controlling the components within the package. Control lines 86A-86D are brazed to the metalized traces 84A-84D on the exterior stepped portion 82 as illustrated. A portion of the lower interior side walls 76 and the stepped portion 78, opposite the control traces 84, carry a metalization 87 as illustrated. Likewise, opposite portions of the upper side wall 74 carry metalizations 88 and 90 as illustrated. Metal bus bars or straps 92, 94 and 96 are secured to the metalizations 87, 88 and 90 by brazing. The strap 92 is likewise brazed along its edge 93 to the lower surface 60 as illustrated and the straps 94 and 96 are brazed along their respective edges 95 and 97 to the upper surface 58.

Figure 1:
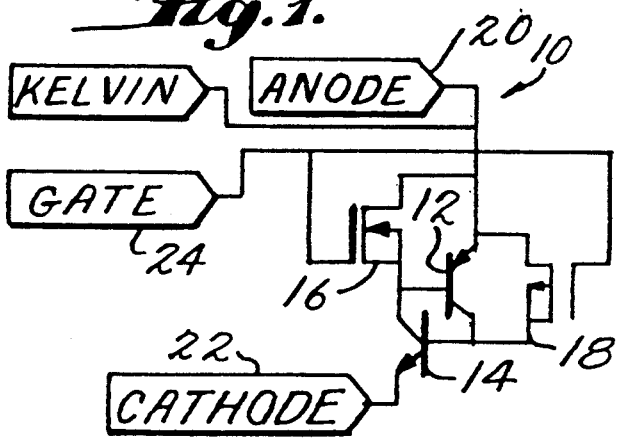
FIG. 1 is a schematic diagram of the equivalent circuit for a known MOS control thyristor (MCT)
Figure 2:
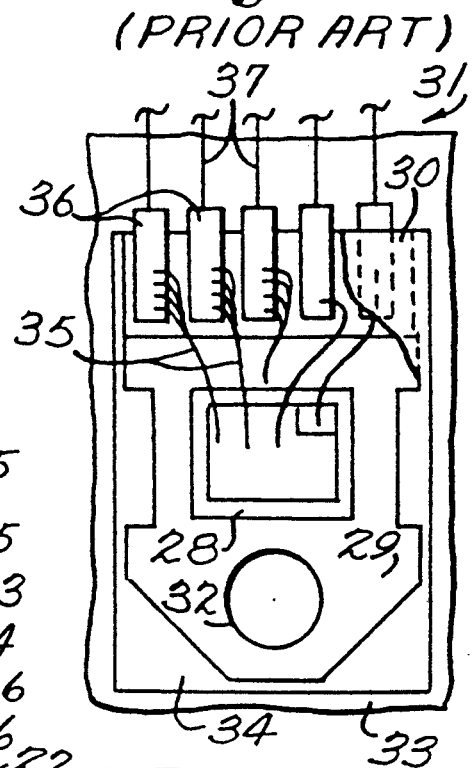
FIG. 2 is a plan view of a known package for a semiconductor device.

In accordance with the invention, the MCT 10 and diode 42 of the switch 40 are surface mounted on the conductive lower surface 60 and the zener diodes 48 are mounted to the stepped surface 78 at metalizations 84A and 84B. In the particular arrangement illustrated, the MCT 10 is a chip which has metalized upper and lower planar surfaces 102 and 104. The lower surface 104 forms the cathode 22 (FIG. 1) and a major portion 106 of the upper surface 102 forms the anode 20 (FIG. 1). A minor portion 108 of the upper surface 102 is metalized and forms the gate portion 24 (FIG. 1). The metalized surface 104 of the chip 10 is soldered to the lower surface 60 as shown. The surface 106 of the chip 10 is metalized and connected to the strap 94 by means of a plurality of ultrasonically bonded wire leads 114. Likewise, minor portion 108 is connected to the metalizations or traces 86A and 86B as illustrated by leads 115.

Zener diodes 48 are chips which are secured at their anode, one each, to the respective control lead metalizations 84A and 84B. The zener diodes 48 are connected back-to-back (cathode-to-cathode) by jumper wire 107.

Figure 6:
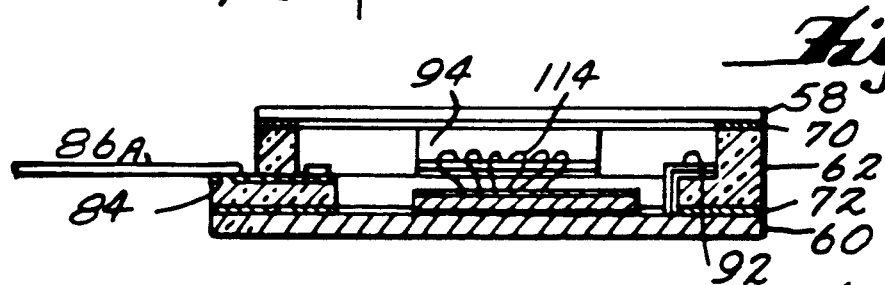
FIGS. 6-8 are side sectional views of the package illustrated in FIG. 5, respectively, taken along lines 6—6, 7—7 and 8—8.
Figure 7:
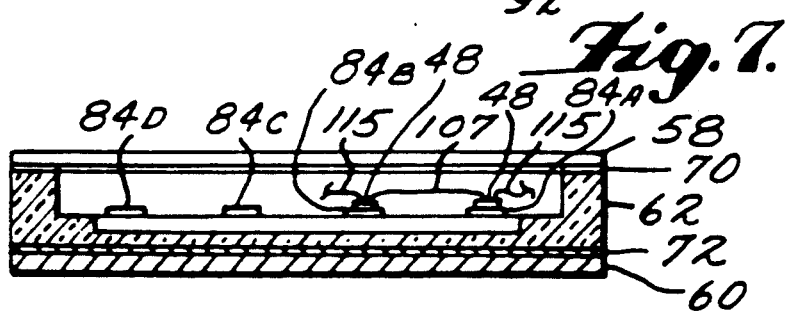
Figure 8:
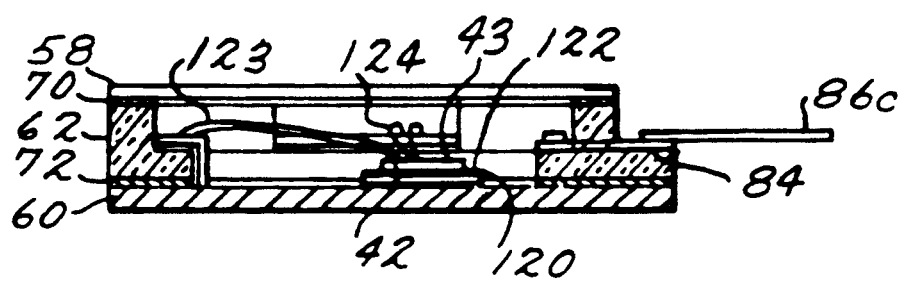

In accordance with the invention, as can be seen in FIG. 6, when the MCT 10 conducts, current flows from the lower surface 60 through the chip to the upper surface 58 via the anode leads 114 and the strap 94. The current flows directly through the package from one relatively large conductor 60 to the opposite conductor 58. The large conductor size plus the uniform spacing of the substrates 58 and 60 results in a low inductance low resistance path for the high current.

Figure 4:
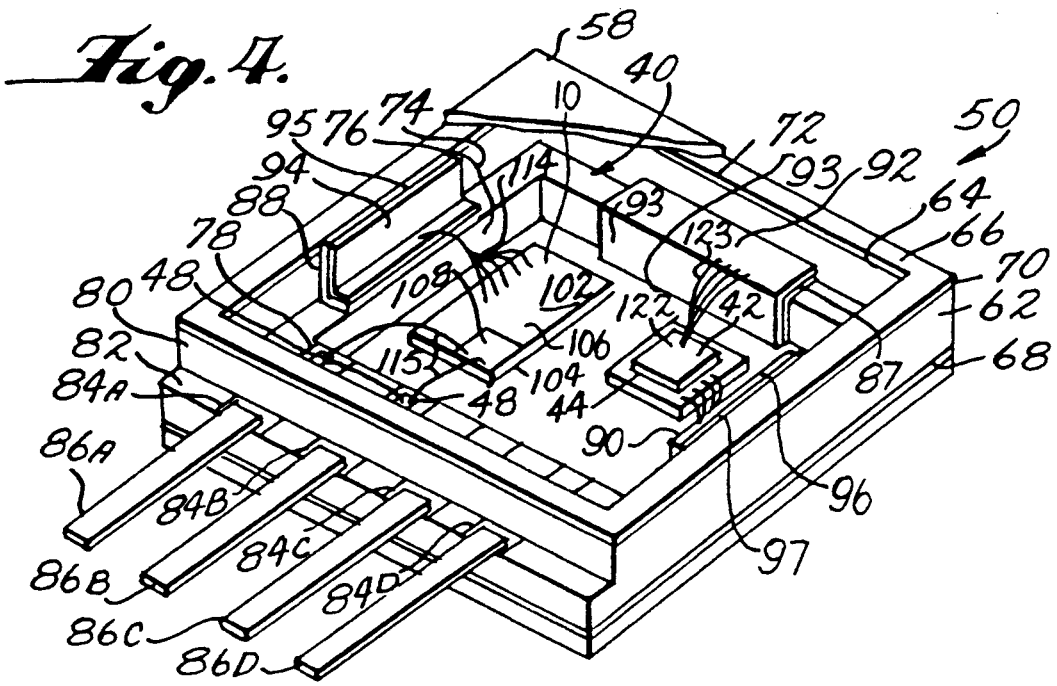
FIG. 4 is a perspective view with portions broken away of a high power semiconductor switching device in accordance with the present invention, employing an MCT, a commutating diode and a gate protection device in a package for supporting the electrical components of the circuit illustrated in FIG. 3.
Figure 5:
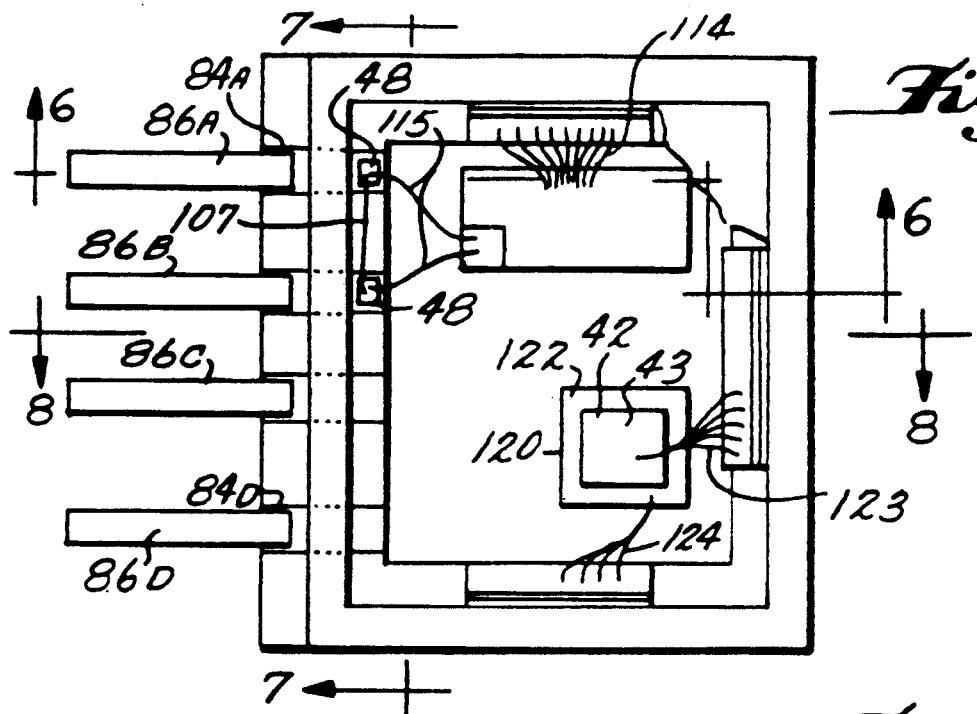
FIG. 5 is a plan view of the package and components illustrated in FIG. 4.

As illustrated in FIG. 4, the diode 42 is a high current device which is mounted on the lower substrate 60 by means of a metalized beryllium oxide substrate 120. The cathode 44 of the diode 42 is secured to the upper metalized surface 122 of substrate 120 by solder. The diode 42 is coupled in anti parallel with the MCT 10 for absorbing reverse currents when the MCT 10 switch is off. In particular, the anode 43 portion of the diode is connected to the substrate 60 which forms the cathode of the MCT 10 by a number of jumper wires 123 to strap 92. The cathode of the diode 42 is coupled to the substrate 58 by a number of jumper wires 124 to strap 96.

A major reduction in the inductive and resistive parasitics is achieved by the present invention. For example, in FIG. 3 the package parasitics in the anode and cathode R1, L1 and R2, L2 are significantly reduced, because the substrates 50 and 60 are large area, low resistance parallel plates. The device lead cathode parasitics L4 R4 are now greatly reduced. This occurs because the MCT 10 is directly bonded to the substrate 60 thereby reducing the device lead path length, hence reducing inductance L4; and increasing the contact surface area with the substrate 60, hence reducing resistance R4. The device parasistics L3 and R3 on the anode side are reduced because a larger number of short anode leads join the metalized anode surface to the surfaces of the strap 94, thereby resulting in lower parasitics. Likewise, with the device parasitics L5, R5, L6 and R6 for the diode 42 are reduced by the short leads and large straps.

The substrates 58 and 60 have high thermal mass and high surface area. When a high current flows in the MCT 10, heat generated in the chip is quickly and efficiently conducted directly to the substrate 60 through the lower metalized surface of the chip. Also, heat is conducted via the anode leads 114 to the strap 94 and the cover substrate 58. In addition, radiated and convected heat from the chip is carried to the substrates 50 and 60. By these three mechanisms, but especially by direct conduction, heat is efficiently dissipated.

In a particular embodiment employing an MCT 10, peak current capacity is about 300 A. RMS current is about 100 A and the standoff voltage is about 1000 V. In addition the switch can handle a peak current of about 1000 A or about 0.1 ms. Of course, other high current switching devices such as an insulated gate bipolar transistor (IGBT) may be similarly packaged in accordance with the invention for good thermal and parasitic management.

While there have been described what at present are considered to be the preferred embodiments of the present invention, it will be readily apparent to those skilled in the art that various changes may be made therein without departing from the invention and it is intended in the claims to cover such changes and modifications as fall within the true spirit and scope of the invention.

What is claimed is:

1. A package for surface mounting a high power electronic switch in the form of a semiconductor chip having metalized planar cathode and anode terminals and a gate terminal, the switch being operative in response to an enabling signal on the gate terminal to carry a current between the cathode and the anode comprising:

a refractory annular ring having planar open end faces and interconnecting side walls having an intermediate stepped portion;

first and second thermally and electrically conductive planar substrates being respectively bonded to the opposite end faces of the annular ring and being maintained in spaced relation thereby forming an enclosed space; and at least one conductive strap within the space being supported by the stepped portion of the side wall and extending to the first substrate, thereby forming an electrical and thermal path between the first substrate and strap;

wherein, the second substrate receives one of the planar terminals of the chip and the strap is electrically coupled to the other planar terminal to form a high current path between the first and second substrates via the strap, and allow the first and second substrates to dissipate thermal energy when the switch is operative.

2. A high powered self commutating semiconductor switch employing a MOS controlled thyristor (MCT) chip having opposite first and second planar electrically conductive current carrying terminal faces and a gating terminal comprising:

a conductive base having peripheral marginal edges for surface mounting the chip in intimate thermal and electrical contact with the first terminal face of the chip;

a conductive cover portion having peripheral marginal edges spaced from the base and being in electrical and thermal contact with the second terminal face of the chip;

a refractory support ring having spaced apart opposite faces and at least one interior sidewall portion, said ring being attached to the base and cover at the peripheral marginal edges for surrounding and enclosing the chip in a space between the cover and base; and at least one conductive strap means mounted on the side wall portion of the support ring;

wherein, the strap is electrically coupled to the chip and the cover to allow the switch, when actuated, to carry a current between the cover and base via the strap, such that the base and cover remove thermal energy resulting from the current flow.

3. The apparatus of claim 2, wherein: the interior side wall portion of the ring has a stepped portion;

the stepped portion of the interior side wall includes a plurality of metalizations; and, the base, cover and strap are bonded to the ring at the plurality of metalizations.

4. The apparatus of claim 3, wherein the strap geometrically conforms to the metalizations included on the interior side wall.

5. The apparatus of claim 3, wherein the support ring includes an exterior stepped portion and at least one metalized trace extending from the stepped portion within the space to the stepped portion exterior of the space and a conductive strap attached to the metalized trace exterior of the support ring.

6. The apparatus of claim 2, wherein said MCT is capable of switching a peak current of about 300 amps and the chip carrier conducts said peak current from the base to the cover via the strap and said MCT.

7. The apparatus according to claim 6, wherein the MCT when actuated carries a current of about 100 amps RMS.

8. The apparatus according to claim 7, wherein the MCT supports a stand off voltage of about 1,000 volts.

9. The apparatus according to claim 8, wherein the MCT carries a peak current of about 1,000 amps for less than about 0.1 milliseconds.

10. The apparatus according to claim 2, further including a diode having a respective cathode and anode terminal for controlling the MCT and an insulating substrate for supporting the diode on the base, said insulating substrate having a metalized surface in contact with the anode terminal of the diode; and the base and the cathode surface being in electrical contact with the anode of the MCT.

11. The apparatus according to claim 10, further including a strap for the diode mounted to the side wall and contacting the cover; and a lead from the said cathode terminal of the diode to said strap.

12. The apparatus according to claim 11, wherein the insulating support for the diode is a beryllium oxide refractory material.

13. The apparatus according to claim 2, further including gate protection means in the form of back to back zener diodes secured to the traces on the stepped portion.

* * * * *